United States Patent
Cho et al.

(10) Patent No.: US 10,268,798 B2
(45) Date of Patent: Apr. 23, 2019

(54) CONDITION ANALYSIS

(71) Applicant: International Business Machines Corporation, Armonk, NY (US)

(72) Inventors: Minsik Cho, Austin, TX (US); Indira Nair, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 14/860,960

(22) Filed: Sep. 22, 2015

(65) Prior Publication Data

US 2017/0083637 A1 Mar. 23, 2017

(51) Int. Cl.
*G06F 17/50* (2006.01)

(52) U.S. Cl.
CPC .......... *G06F 17/509* (2013.01); *G06F 17/505* (2013.01); *G06F 17/5009* (2013.01); *G06F 17/5022* (2013.01); *G06F 17/5045* (2013.01)

(58) Field of Classification Search
USPC ........................ 703/2, 13, 5, 6; 716/102, 113
See application file for complete search history.

(56) References Cited

U.S. PATENT DOCUMENTS

| | | | |
|---|---|---|---|
| 5,937,190 A | 8/1999 | Gregory et al. | |
| 6,163,876 A | 12/2000 | Ashar et al. | |
| 6,516,453 B1 | 2/2003 | Knapp | |
| 6,581,191 B1 | 6/2003 | Schubert et al. | |
| 7,146,583 B1 * | 12/2006 | Sun | G06F 17/5045 716/113 |
| 7,383,529 B2 | 6/2008 | Gupta et al. | |
| 7,882,462 B2 | 2/2011 | Ogilvie et al. | |

(Continued)

FOREIGN PATENT DOCUMENTS

EP 1187044 A2 3/2002

OTHER PUBLICATIONS

A.A. Kountouris et al., "Efficient Scheduling of Conditional Behaviors for High-Level Synthesis," ACM Transactions on Design Automation of Electronic Systems, Jul. 2002, pp. 380-412, vol. 7, No. 3.

(Continued)

*Primary Examiner* — Thai Q Phan
(74) *Attorney, Agent, or Firm* — Rabin Bhattacharya; Ryan, Mason & Lewis, LLP

(57) ABSTRACT

A method for condition analysis comprises receiving an algorithmic description of a hardware design, wherein the algorithmic description is specified using a programming language, generating an intermediate representation based on the algorithmic description, wherein the intermediate representation includes a plurality of nodes and a plurality of paths, wherein each path connects at least one node to at least one other node, computing a plurality of relationships between the plurality of nodes, wherein the plurality of relationships are based on the plurality of paths connecting the plurality of nodes and each relationship includes at least one of a dominance relationship and a post-dominance relationship between two or more nodes, partitioning the intermediate representation based on the computed relationships, performing an optimization using the partitioned intermediate representation, and converting results of the optimization to the hardware design.

20 Claims, 5 Drawing Sheets

(56) References Cited

U.S. PATENT DOCUMENTS

| | | | | |
|---|---|---|---|---|
| 7,890,928 | B2* | 2/2011 | Patrudu | G06F 17/2785 |
| | | | | 707/802 |
| 8,666,702 | B2* | 3/2014 | Schell | G06F 17/50 |
| | | | | 345/420 |
| 8,799,838 | B2* | 8/2014 | Tanimoto | G06F 17/5045 |
| | | | | 716/107 |
| 9,003,352 | B2 | 4/2015 | Yamamoto et al. | |
| 9,176,760 | B2* | 11/2015 | Halambi | G06F 9/45516 |
| 2006/0074857 | A1* | 4/2006 | Etzold | G06F 17/30321 |
| 2008/0320031 | A1* | 12/2008 | Denoual | G06F 17/2247 |
| 2011/0099528 | A1 | 4/2011 | Miyaoka | |
| 2013/0227505 | A1* | 8/2013 | Tanimoto | G06F 17/504 |
| | | | | 716/107 |
| 2017/0054613 | A1* | 2/2017 | Keahey | G06F 3/0482 |

OTHER PUBLICATIONS

R. Sinha et al., "Abstract State Machines as an Intermediate Representation for High-Level Synthesis," Design, Automation & Test in Europe Conference & Exhibition (DATE), Mar. 2011, 6 pages, Grenoble, France.

Wikipedia, "High-Level Synthesis," https://en.wikipedia.org/wiki/High-level_synthesis, Sep. 4, 2015, 5 pages.

Wikipedia, "Dominator (graph theory)," https://en.wikipedia.org/wiki/Dominator_(graph_theory), May 24, 2015, 6 pages.

* cited by examiner

300

400

500

600

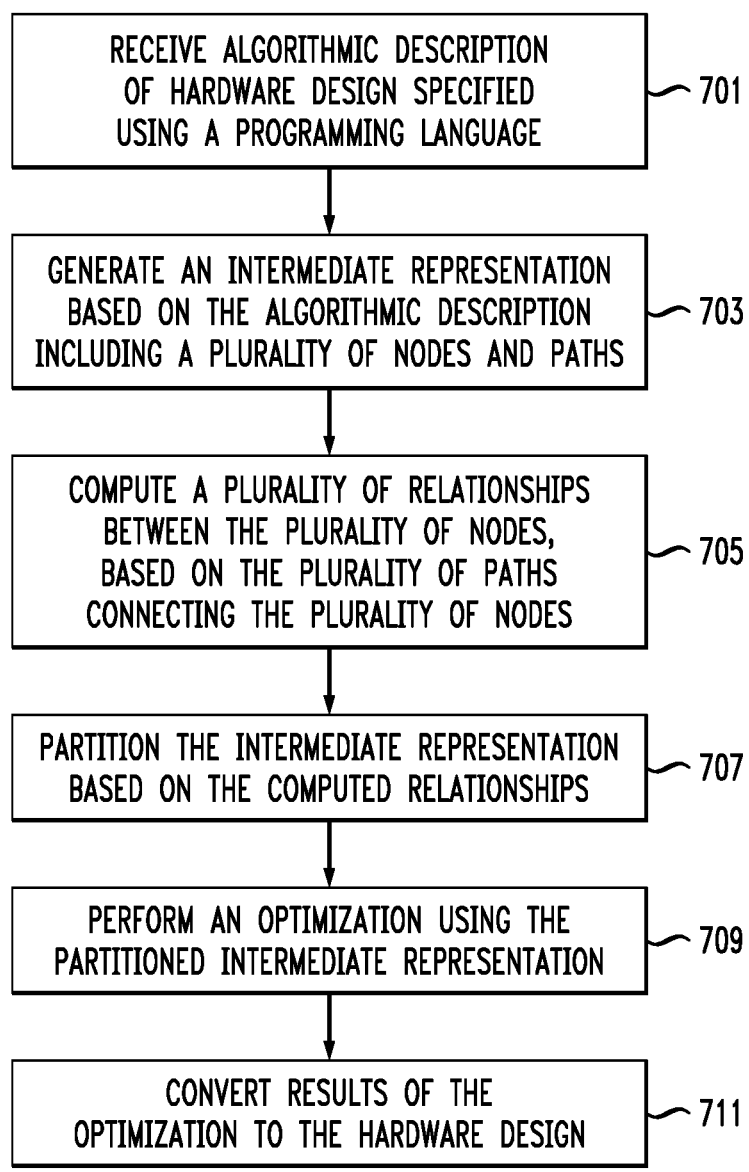

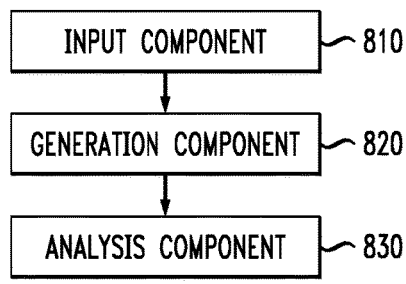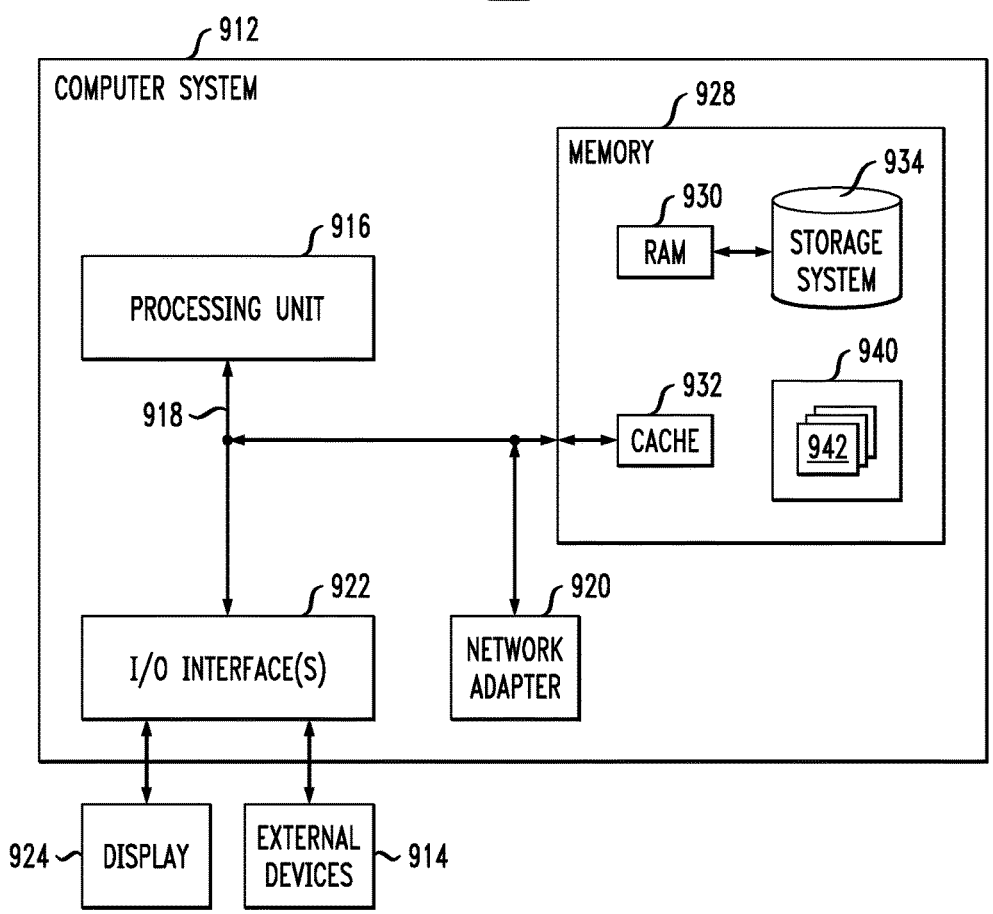

CONDITION ANALYSIS

TECHNICAL FIELD

The field generally relates to condition analysis and, in particular, to condition analysis based on dominance and post-dominance relationships.

BACKGROUND

High-level synthesis (HLS) is a process by which hardware designs can be generated from an algorithmic specification of the desired behavior of the hardware. A language used for the algorithmic description can be, for example, a programming language, such as C, C++ or variants thereof. Levels of abstraction in connection with hardware design can include gate level, register-transfer level (RTL) and algorithmic level. HLS starts with a high level of abstraction at the algorithmic level, where a designer specifies the algorithmic description using the appropriate programming language. The code is transformed into RTL implementations, which are then used to develop a gate level implementation.

IF-conversion is a transformation which converts control dependencies into data dependencies. Data dependencies refer to program statements that depend on data of a preceding program statement. A program instruction is control dependent on a preceding instruction if the outcome of preceding instruction determines whether the subsequent program instruction is to be executed. Condition analysis is a full-scale version of if-conversion. Non full-scale versions of if-conversion are regional and selective based on performance-gain. Full-scale if-conversion analysis is typically required for certain types of optimizations, such as HLS optimization, and concurrent very high speed integrated circuit (VHSIC) hardware description language (VHDL).

SUMMARY

In general, exemplary embodiments of the invention relate to condition analysis and, in particular, to condition analysis based on dominance and post-dominance relationships.

According to an exemplary embodiment of the present invention, a method for condition analysis comprises receiving an algorithmic description of a hardware design, wherein the algorithmic description is specified using a programming language, generating an intermediate representation based on the algorithmic description, wherein the intermediate representation includes a plurality of nodes and a plurality of paths, wherein each path connects at least one node to at least one other node, computing a plurality of relationships between the plurality of nodes, wherein the plurality of relationships are based on the plurality of paths connecting the plurality of nodes and each relationship includes at least one of a dominance relationship and a post-dominance relationship between two or more nodes, partitioning the intermediate representation based on the computed relationships, performing an optimization using the partitioned intermediate representation, and converting results of the optimization to the hardware design.

According to an exemplary embodiment of the present invention, a system for condition analysis comprises a memory and at least one processor coupled to the memory, an input component, executed via the at least one processor, wherein the input component is capable of receiving an algorithmic description of a hardware design, wherein the algorithmic description is specified using a programming language, a generation component, executed via the at least one processor and operatively coupled to the input component, wherein the generation component is capable of generating an intermediate representation based on the algorithmic description, wherein the intermediate representation includes a plurality of nodes and a plurality of paths, wherein each path connects at least one node to at least one other node, and an analysis component, executed via the at least one processor and operatively coupled to the generation component, wherein the analysis component is capable of computing a plurality of relationships between the plurality of nodes, wherein the plurality of relationships are based on the plurality of paths connecting the plurality of nodes and each relationship includes at least one of a dominance relationship and a post-dominance relationship between two or more nodes, partitioning the intermediate representation based on the computed relationships, performing an optimization using the partitioned intermediate representation, and converting results of the optimization to the hardware design.

According to an exemplary embodiment of the present invention, a computer program product for condition analysis comprises a computer readable storage medium having program instructions embodied therewith, the program instructions executable by a processor to cause the processor to perform a method comprising receiving an algorithmic description of a hardware design, wherein the algorithmic description is specified using a programming language, generating an intermediate representation based on the algorithmic description, wherein the intermediate representation includes a plurality of nodes and a plurality of paths, wherein each path connects at least one node to at least one other node, computing a plurality of relationships between the plurality of nodes, wherein the plurality of relationships are based on the plurality of paths connecting the plurality of nodes and each relationship includes at least one of a dominance relationship and a post-dominance relationship between two or more nodes, partitioning the intermediate representation based on the computed relationships, performing an optimization using the partitioned intermediate representation, and converting results of the optimization to the hardware design.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 7 is a flow diagram of a process for condition analysis, according to an exemplary embodiment of the invention.

FIG. 8 is a block diagram of a system for condition analysis, according to an exemplary embodiment of the present invention.

FIG. 9 illustrates a computer system in accordance with which one or more components/steps of the techniques of the invention may be implemented, according to an exemplary embodiment of the invention.

DETAILED DESCRIPTION

Exemplary embodiments of the invention will now be discussed in further detail with regard to condition analysis and, in particular, to condition analysis based on dominance and post-dominance relationships. This invention may, however, be embodied in many different forms and should not be construed as limited to the embodiments set forth herein.

As used herein, an "intermediate representation (IR)" can refer to a representation of a design, such as a hardware design, or program, part way between the source and target configurations, such as, for example, between an algorithmic representation and a gate-level implementation and/or between source and target languages. IRs can include a structured representation, such as a graph or tree-based representation.

As used herein, a "node" can refer to a result or an action that is taken based on a condition being satisfied.

As used herein, a "connection", "path" or "branch" between nodes can refer to the linking or channel between nodes.

As used herein, a "condition" can refer to something that is satisfied to get to or exercise a node.

As used herein, "enumerating", "enumeration", "path enumeration" or "condition enumeration" can refer to the processing by which an IR, such as a graph, is traversed by computing conditions to reach one or more nodes. A breadth-first enumeration covers all neighbor nodes before getting to the next level. For example, a breadth-first enumeration starts at a tree root or another node of a graph, and explores the neighbor nodes first, before moving to the next level neighbor nodes, while depth-first enumeration jumps to a next level before exploring neighbor nodes on the same level. For example, a depth-first enumeration starts at a tree root or another node of a graph and explores as far as possible along each branch before backtracking. As a result, if there are multiple paths between two nodes, a depth-first enumeration will discover one of the paths much faster than a breadth-first enumeration.

As used herein an "algorithmic description" can refer to a high-level description of the functioning and/or behavior of hardware. For example, an algorithmic description can be a description to solve a certain problem without giving a detailed implementation. There can be various ways to implement an algorithmic description depending on, for example, programming language and computer platform.

Figure 1:
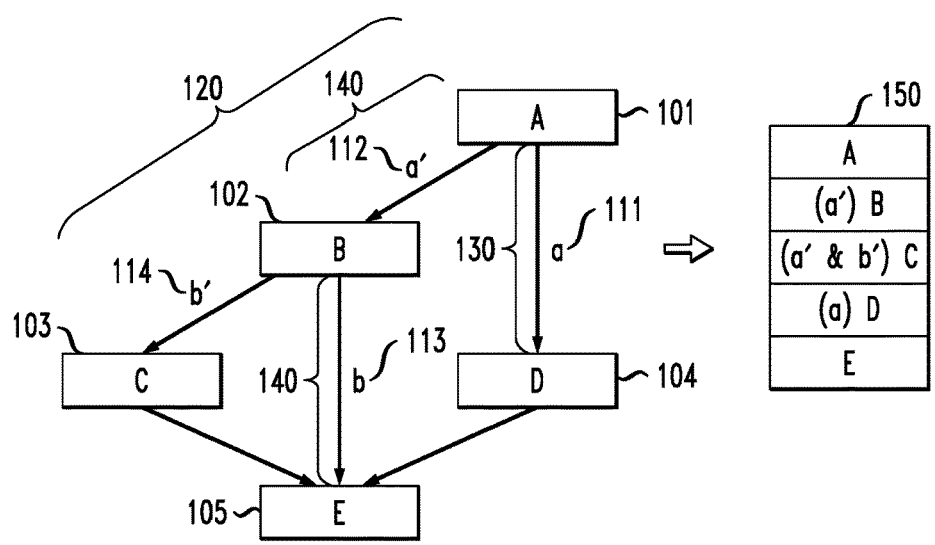
FIG. 1 is diagram illustrating a basic overview of actions that can be taken to reach particular results.

FIG. 1 is a basic overview of actions that can be taken to reach particular results. For example, referring to FIG. 1, nodes A, B, C, D and E 101, 102, 103, 104 and 105 (also referred to as results) are reached based upon certain conditions a, a', b, and b' 111, 112, 113 and 114 being satisfied. As can be seen, to get from node A to E, different paths can be taken. For example, path 120 to E through A, B and C can be taken if a' and b' are satisfied, path 130 to E through A and D can be taken if a is satisfied, and path 140 to E through A and B can be taken if a' and b are satisfied. It can be understood, that depending on decisions made (e.g., conditions satisfied) certain paths may not be taken.

Applying the basic scenario in FIG. 1 to an optimization process such as HLS, there may be, for example, hundreds or thousands of nodes and corresponding paths that may be taken. As can be understood, such full-scale condition analysis, by enumerating all possible paths to each result, is a complicated process, with undesirably high numbers of condition variables and undesirably long path-lengths, leading to exponentially increased computer processing time and computer memory required to complete an optimization.

Accordingly, there is a need for improved and more efficient methods of condition analysis that can be performed without sacrificing the quality of the results of the analysis.

In accordance with embodiments of the present invention, techniques, such as, for example, algorithms using dominance analysis and delta compression of a path, greatly reduce computer processing time and the amount of computer memory required to complete an optimization when compared with conventional full-scale condition analysis. In addition, the embodiments of the present invention are able to achieve the same results as when all paths are computed using conventional full-scale condition analysis.

While the embodiments of the present invention are discussed in connection with HLS, it is to be understood that the embodiments of the present invention are not necessarily limited to HLS, and can be applied to other types of optimizations or problems requiring traversal of condition based structures.

Figure 2:
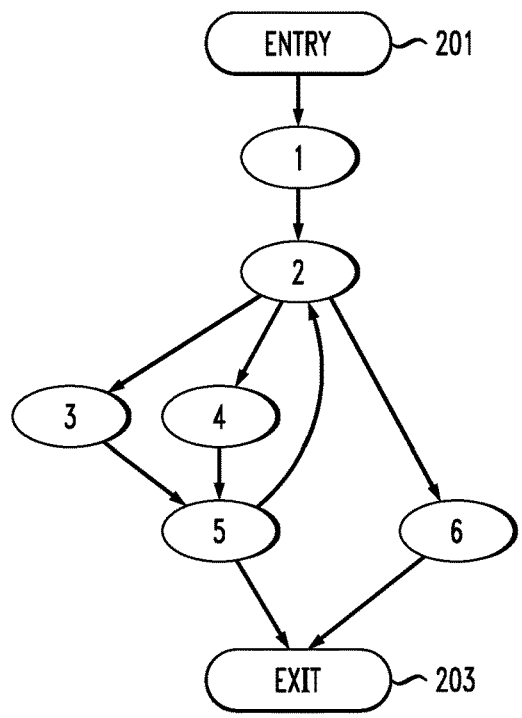
FIG. 2 is a diagram illustrating dominance and post-dominance analysis.

FIG. 2 is a diagram illustrating dominance and post-dominance analysis. In general, a node d dominates a node n if every path from the entry node to node n must go through d. For example, referring to FIG. 2, node 2 dominates nodes 3, 4, 5 and 6 because every path from the entry node 201 to nodes 3, 4, 5 and 6 must go through node 2. Dominance and post-dominance analysis can be done in $O(N^2)$ (order of $N^2$) complexity, where N is the number of nodes, which is applicable to a large scale graph.

In general, a node d post-dominates a node n if every path from node n to the exit node must go through node d. For example, referring to FIG. 2, node 2 post-dominates node 1 because every path from node 1 to the exit node 203 must go through node 2. In addition node 5 post-dominates nodes 3 and 4 because every path from nodes 3 and 4 to the exit node 203 must go through node 5.

Figure 3:
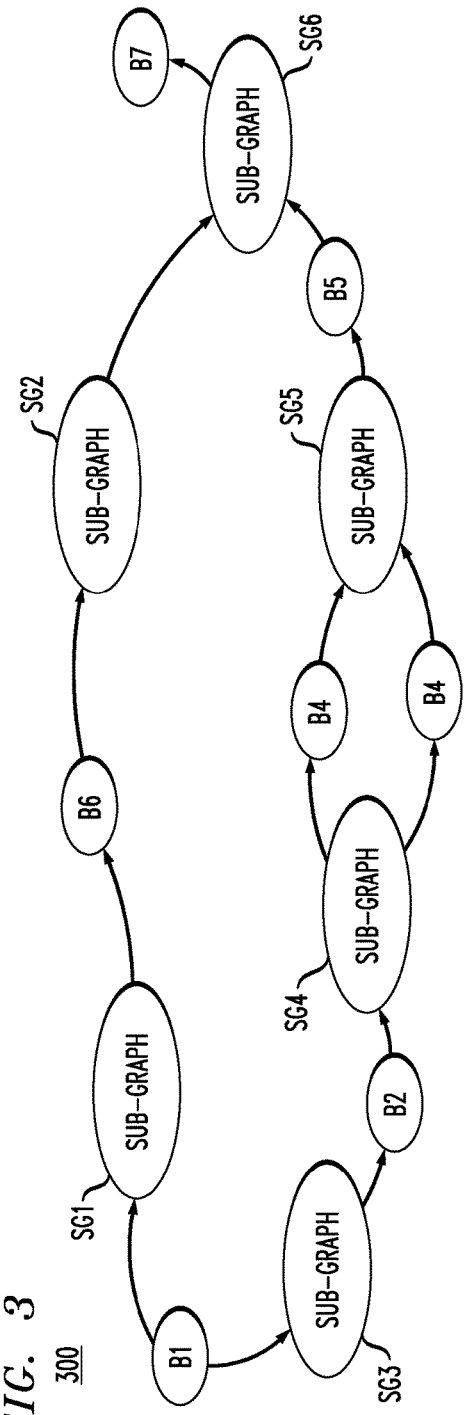
FIG. 3 is a high-level diagram of an intermediate representation graph including a plurality of nodes and a plurality of paths, according to an exemplary embodiment of the invention.

FIG. 3 is a diagram for use in illustrating the application of an algorithm using dominance and post-dominance analysis to complete an optimization, in accordance with an exemplary embodiment of the present invention. FIG. 3 is a high-level diagram of an intermediate representation (IR) graph 300 including a plurality of nodes and a plurality of paths. As can be seen, each path (as shown by arrows) connects at least one node to at least one other node. According to an exemplary embodiment of the present invention, the graph can be based on an algorithmic description of a hardware design that was specified using lines of code in a programming language, such as, for example, C, C++ or variants thereof.

As can be understood from the graph, two or more nodes may be in a particular dominance and/or post-dominance relationship based on the paths connecting the nodes to each other. In accordance with an exemplary embodiment of the present invention, relationships between two or more connected nodes are computed using dominance and post-dominance analysis. Such relationships are determined for each of the nodes in a graph. As noted above, depending on a design, there may be, for example, hundreds or thousands of nodes.

If a relationship between a node A and a node B is computed as being A dominates (dom) and B post-dominates (pdom) A (A dom B and B pdom A), then it can be concluded that nodes A and B in an IR have the same condition. In other words, in order to reach an exit node, if node A is reached, it is a given to reach node B to get to the exit node. Further, assuming additional nodes B, C, D and E, where B dom C and C pdom B, C dom D and D pdom C and D dom E and E pdom D, then it can be assumed that nodes A, B, C, D, E each have the same condition and in order to reach an exit node, if node A is reached, it is a given to reach nodes B, C, D and E to get to the exit node. Such reasoning simplifies optimization because all paths between nodes A and E do not need to be enumerated, and it is sufficient that if node A is reached, it can be assumed that nodes B, C, D and E will also be reached to get to an exit node. In this case, given the determination of these relationships between nodes, it is not necessary to enumerate paths from node A through nodes B, C and D to node E, thereby saving memory and processing time to run an optimization.

Referring to FIG. 3, with respect to nodes B1 and B7, it can be concluded that if node B1 is reached, node B7 will also be reached unconditionally to get to an exit node, because B1 dom B7 and B7 pdom B1. It can be further understood that B2 dom B5 and B5 pdom B2 so that if node B2 is reached, node B5 will also be reached to get to an exit node. Therefore, like the situation with nodes A-E described above, the computation of the relationships between nodes simplifies optimization because all paths between nodes B1 and B7 do not need to be computed, and it is sufficient that if, for example node B2 is reached, it can be assumed that nodes B4, B5, and B7 will also be reached to get to an exit node. The ovals SG1, SG2, SG3, SG4, SG5 and SG6 in FIG. 3 represent sub-graphs. An indication of a sub-graph shows that there are other graph structure between nodes, for example, between nodes B1 and B6, B6 and B7, B1 and B2, B2 and B4, B4 and B5, and B5 and B7. The indication of a sub-graph helps to illustrate that the nodes that the sub-graph is between will have the same condition regardless of the internal structure of that sub-graph. Embodiments of the current invention can be applied to a sub-graph recursively to determine all of the conditions inside the sub-graph.

Figure 4:
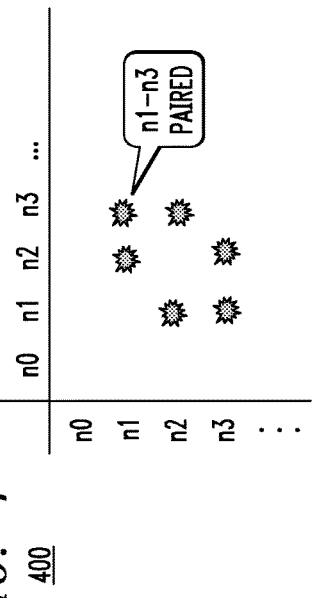
FIG. 4 illustrates a two-dimensional same-condition matrix, according to an exemplary embodiment of the invention.

FIG. 4 illustrates a two-dimensional same-condition matrix 400, which shows which nodes of nodes n0, n1, n2, n3 . . . nx (x being an integer) are grouped together as having a same condition with each other. For example, nodes n1 and n2 and n1 and n3 are paired. Also, because n1 is paired with n2 and n3, it follows that n2 and n3 have the same condition as each other.

Figure 5:
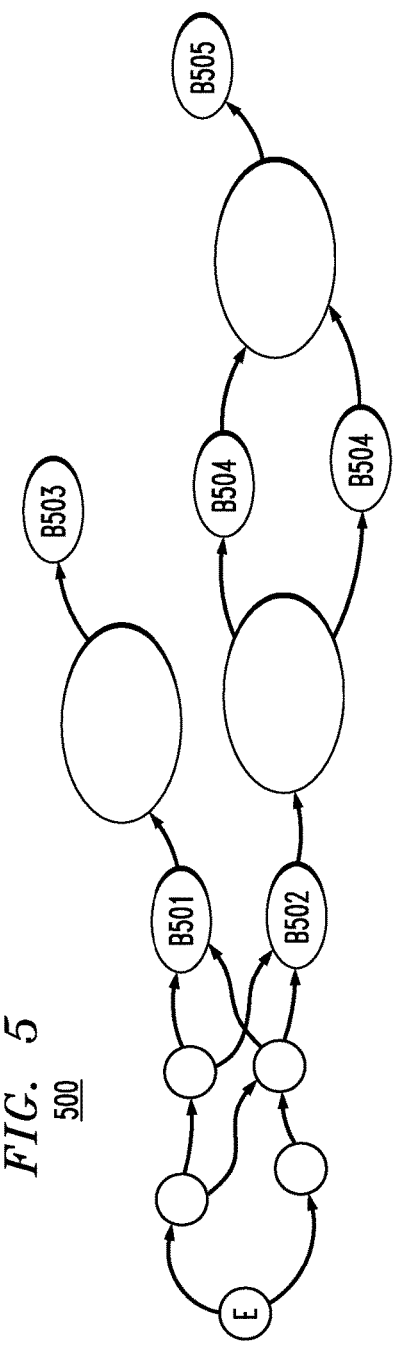
FIG. 5 illustrates an intermediate representation graph including an entry node, and barrier nodes, according to an exemplary embodiment of the invention.

In accordance with an embodiment, an IR, such as graph 500 in FIG. 5, is partitioned by marking grouped nodes as barrier nodes, and using information on how the nodes are grouped with each other to consolidate condition enumeration. FIG. 5 illustrates an IR graph 500 including an entry node E, and barrier nodes B501, B502, B503, B504 and B505. In accordance with an embodiment of the present invention, performing an optimization using the partitioned graph 500 comprises beginning a depth-first condition enumeration from the entry node E while stacking the path/conditions from the entry node E. As can be understood from FIG. 5, for example, there are more than two paths from entry node E to barrier node B501, and each of the paths is a valid path or one of the conditions. Therefore, to capture an entirety of the possible conditions, it is necessary to add-up/combine/stack such paths all together. The combined condition is applied to B503, since B501 and B503 shall have the same execution condition.

As noted above, embodiments of the present invention can work on sub-graphs recursively, wherein the sub-graphs are separated by barrier nodes. As a way to implement the recursion, whenever a sub-graph is encountered, the sub-graph can be enqueued for processing. When a queue is empty, it implies that no sub-graph is left or all sub-graphs have been processed. Since a total graph can be treated as a sub-graph, a condition enumeration is started with the total graph in the queue at the beginning of an algorithm.

Referring to FIG. 5, the condition enumeration is halted at a barrier node, such as for example, barrier node B501 and B502. As can be seen from graph 500, nodes B501 and B503 can be concluded as having the same condition as each other, while nodes B502, B504 and B505 can be concluded as having the same condition as each other. Accordingly, once a path from entry node E to barrier node B501 is finalized (understanding that there can be more than one path to node B501 in the example in FIG. 5, and a path of a plurality of paths can be chosen), the corresponding condition can be obtained, and further reused as a condition from barrier node B501 to barrier node B503, which is grouped with barrier node B501. In other words, once the condition(s) from entry node E to node B501 is known, the condition(s) to node B503 is also known. Similarly, once the path from entry node E to node B502 is finalized, the corresponding condition can be obtained, and the same condition(s) applied to the barrier node B502 can also be applied to barrier nodes B504 and B505, which are grouped with barrier node B502. In other words, once the condition(s) from entry node E to node B502 is known, the condition(s) to nodes B504 and B505 is also known. The finalized conditions applied to the barrier nodes B501-B505 can be stored so that when resuming the condition enumeration toward an exit node, further traversals are not required to start from the entry node, but can instead commence from a last barrier node to which a condition has been finalized and applied, thereby avoiding revisiting previous traversals, and saving processing time and memory.

Figure 6:
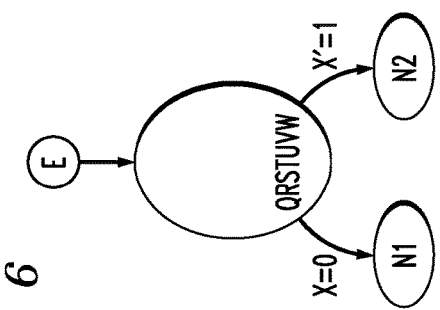
FIG. 6 is a diagram illustrating delta compression of paths, in accordance with an exemplary embodiment of the present invention.

FIG. 6 is a diagram illustrating delta compression of paths, in accordance with an embodiment of the present invention. Referring to FIG. 6, a plurality of paths Q, R, S, T, U, V and W from an entry node E to one or more nodes N1 and N2 are determined to be the same or similar. For example, from entry node E to a big node (e.g., including paths QRSTUVW), there is one condition, which then splits up into X=0 or X=1. So, only the following condition (X=0 or X=1) will be different, making paths to nodes N1 and N2 very similar. In order to reduce a memory footprint, the same or similar paths are grouped under a variable assigned to represent the paths QRSTUVW. For example, Y=QRSTUVW, so that QRSTUVW+X to get to node N1 and QRSTUVW+X' to get to node N2 can be replaced by Y+X and Y+X'. Y is a variable that is used to represent the multiple paths QRSTUVW when performing analysis in different places and/or at different times.

FIG. 7 is a flow diagram of a process for condition analysis, according to an exemplary embodiment of the invention. Referring to FIG. 7, the process 700 includes, at block 701, receiving an algorithmic description of a hardware design, wherein the algorithmic description is specified using a programming language, such as, for example, C, C++ or variants thereof.

The process includes, at block 703, generating an intermediate representation based on the algorithmic description, such as, for example, a graph, wherein the intermediate representation includes a plurality of nodes and a plurality of paths, wherein each path connects at least one node to at least one other node. At block 705, a plurality of relationships between the plurality of nodes are computed. The plurality of relationships are based on the plurality of paths connecting the plurality of nodes and each relationship includes at least one of a dominance relationship and a post-dominance relationship between two or more nodes. Computing the plurality of relationships may comprise grouping nodes having a same condition with each other, and a matrix can be built indicating the nodes having the same condition with each other.

The process further includes, at block 707, partitioning the intermediate representation based on the computed relationships. In accordance with an embodiment of the present invention, partitioning the intermediate representation comprises marking the nodes having the same condition with each other as barrier nodes. At block 709, the process includes performing an optimization using the partitioned intermediate representation. Performing the optimization using the partitioned intermediate representation may comprise beginning a condition enumeration from a first node, such as an entry node, halting the condition enumeration at a barrier node, applying one or more conditions (e.g., finalized conditions) to the barrier node, and applying the one or more conditions to each node grouped with the barrier node as having the same condition as the barrier node. Performing the optimization can also include storing, in for example, a memory (e.g., memory 928 in FIG. 9), the applied one or more conditions for the barrier node and each node grouped with the barrier node, and resuming the condition enumeration from a last node grouped with the barrier node so as not to revisit previously performed enumerations.

The process also includes, at block 711, converting results of the optimization to the hardware design. According to an embodiment, the specified algorithmic description includes a plurality of lines programming code written in the programming language, and the process may further include transforming the lines of programming code into one or more register-transfer level (RTL) implementations, and developing one or more gate level implementations from the one or more RTL implementations.

According to an embodiment, in order to reduce a memory footprint, the process can also include grouping same or similar paths of the plurality of paths under a variable assigned to represent the plurality of paths.

FIG. 8 is a block diagram of a system for condition analysis, according to an exemplary embodiment of the present invention. As shown in FIG. 8 by lines and/or arrows, the components of the system 800 are operatively coupled to each other via, for example, physical connections, such as wired and/or direct electrical contact connections, and wireless connections, such as, for example, WiFi, BLUETOOTH®, IEEE 802.11, and/or networks, including but not limited to, a local area network (LAN), wide area network (WAN), cellular network, satellite network or the Internet.

Referring to FIG. 8, the system 800 includes an input component 810, executed via at least one processor, wherein the input component is capable of receiving the algorithmic description of a hardware design specified using a programming language. The system also includes a generation component 820, executed via at least one processor and operatively coupled to the input component 810. The generation component 820 is capable of generating an intermediate representation based on the algorithmic description, wherein the intermediate representation includes a plurality of nodes and a plurality of paths, wherein each path connects at least one node to at least one other node.

The system 800 also includes an analysis component 830, executed via at least one processor and operatively coupled to the generation component 820. The analysis component 830 is capable of computing a plurality of relationships between the plurality of nodes, wherein the plurality of relationships are based on the plurality of paths connecting the plurality of nodes and each relationship includes at least one of a dominance relationship and a post-dominance relationship between two or more nodes. The analysis component 830 is also capable of partitioning the intermediate representation based on the computed relationships, performing an optimization using the partitioned intermediate representation, and converting results of the optimization to the hardware design. According to an embodiment of the present invention, the analysis component is further capable of building a matrix indicating the nodes having the same condition with each other.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

One or more embodiments can make use of software running on a general-purpose computer or workstation. With reference to FIG. 9, in a computing node 910 there is a computer system/server 912, which is operational with numerous other general purpose or special purpose computing system environments or configurations. Examples of well-known computing systems, environments, and/or configurations that may be suitable for use with computer system/server 912 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 912 may be described in the general context of computer system executable instructions, such as program modules, being executed by a computer system. Generally, program modules may include routines, programs, objects, components, logic, data structures, and so on that perform particular tasks or implement particular abstract data types. Computer system/server 912 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 912 in computing node 910 is shown in the form of a general-purpose computing device. The components of computer system/server 912 may include, but are not limited to, one or more processors or processing units 916, a system memory 928, and a bus 918 that couples various system components including system memory 928 to processor 916.

The bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 912 typically includes a variety of computer system readable media. Such media may be any available media that is accessible by computer system/server 912, and it includes both volatile and non-volatile media, removable and non-removable media.

The system memory 928 can include computer system readable media in the form of volatile memory, such as random access memory (RAM) 930 and/or cache memory 932. The computer system/server 912 may further include other removable/non-removable, volatile/nonvolatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 918 by one or more data media interfaces. As depicted and described herein, the memory 928 may include at least one program product having a set (e.g., at least one) of program modules that are configured to carry out the functions of embodiments of the invention. A program/utility 940, having a set (at least one) of program modules 942, may be stored in memory 928 by way of example, and not limitation, as well as an operating system, one or more application programs, other program modules, and program data. Each of the operating system, one or more application programs, other program modules, and program data or some combination thereof, may include an implementation of a networking environment. Program modules 942 generally carry out the functions and/or methodologies of embodiments of the invention as described herein.

Computer system/server 912 may also communicate with one or more external devices 914 such as a keyboard, a pointing device, a display 924, etc., one or more devices that enable a user to interact with computer system/server 912, and/or any devices (e.g., network card, modem, etc.) that enable computer system/server 912 to communicate with one or more other computing devices. Such communication can occur via Input/Output (I/O) interfaces 922. Still yet, computer system/server 912 can communicate with one or more networks such as a local area network (LAN), a general wide area network (WAN), and/or a public network (e.g., the Internet) via network adapter 920. As depicted, network adapter 920 communicates with the other components of computer system/server 912 via bus 918. It should be understood that although not shown, other hardware and/or software components could be used in conjunction with computer system/server 912. Examples, include, but are not limited to: microcode, device drivers, redundant processing units, external disk drive arrays, RAID systems, tape drives, and data archival storage systems, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for condition analysis, comprising:
   receiving an algorithmic description of a hardware design, wherein the algorithmic description is specified using a programming language;
   generating an intermediate representation based on the algorithmic description, wherein the intermediate representation includes a plurality of nodes and a plurality of paths, wherein each path connects at least one node to at least one other node;
   computing a plurality of relationships between the plurality of nodes, wherein the plurality of relationships are based on the plurality of paths connecting the plurality of nodes and each relationship includes at least one of a dominance relationship and a post-dominance relationship between two or more nodes;
   partitioning the intermediate representation based on the computed relationships;
   performing an optimization using the partitioned intermediate representation; and
   converting results of the optimization to the hardware design;
   wherein the receiving, generating, computing, partitioning, performing and converting steps are performed by a computer system comprising a memory and at least one processor coupled to the memory.

2. The method according to claim 1, wherein computing the plurality of relationships comprises grouping nodes having a same condition with each other.

3. The method according to claim 2, further comprising building a matrix indicating the nodes having the same condition with each other.

4. The method according to claim 2, wherein partitioning the intermediate representation comprises marking the nodes having the same condition with each other as barrier nodes.

5. The method according to claim 4, wherein performing the optimization using the partitioned intermediate representation comprises:
   beginning a condition enumeration from a first node;
   halting the condition enumeration at a barrier node;
   applying one or more conditions to the barrier node; and
   applying the one or more conditions to each node grouped with the barrier node as having the same condition as the barrier node.

6. The method according to claim 5, wherein performing the optimization using the partitioned intermediate representation further comprises storing the applied one or more conditions for the barrier node and each node grouped with the barrier node.

7. The method according to claim 6, wherein performing the optimization using the partitioned intermediate representation further comprises resuming the condition enumeration from a last node grouped with the barrier node.

8. The method according to claim 1, further comprising grouping same or similar paths of the plurality of paths.

9. The method according to claim 8, further comprising assigning a variable to represent the plurality of paths.

10. The method according to claim 1, wherein the specified algorithmic description includes a plurality of lines programming code written in the programming language, and the method further comprises transforming the lines of programming code into one or more register-transfer level (RTL) implementations.

11. The method according to claim 10, further comprising developing one or more gate level implementations from the one or more RTL implementations.

12. The method according to claim 1, wherein the intermediate representation is a graph.

13. A system for condition analysis, comprising:
   a memory and at least one processor coupled to the memory;
   an input component, executed via the at least one processor, wherein the input component is capable of receiving an algorithmic description of a hardware design, wherein the algorithmic description is specified using a programming language;

a generation component, executed via the at least one processor and operatively coupled to the input component, wherein the generation component is capable of generating an intermediate representation based on the algorithmic description, wherein the intermediate representation includes a plurality of nodes and a plurality of paths, wherein each path connects at least one node to at least one other node; and an analysis component, executed via the at least one processor and operatively coupled to the generation component, wherein the analysis component is capable of:

computing a plurality of relationships between the plurality of nodes, wherein the plurality of relationships are based on the plurality of paths connecting the plurality of nodes and each relationship includes at least one of a dominance relationship and a post-dominance relationship between two or more nodes;

partitioning the intermediate representation based on the computed relationships;

performing an optimization using the partitioned intermediate representation; and converting results of the optimization to the hardware design.

14. The system according to claim 13, wherein computing the plurality of relationships comprises grouping nodes having a same condition with each other.

15. The system according to claim 14, wherein the analysis component is further capable of building a matrix indicating the nodes having the same condition with each other.

16. The system according to claim 14, wherein partitioning the intermediate representation comprises marking the nodes having the same condition with each other as barrier nodes.

17. The system according to claim 16, wherein performing the optimization using the partitioned intermediate representation comprises:

beginning a condition enumeration from a first node;
halting the condition enumeration at a barrier node;
applying one or more conditions to the barrier node; and
applying the one or more conditions to each node grouped with the barrier node as having the same condition as the barrier node.

18. The system according to claim 17, wherein the memory stores the applied one or more conditions for the barrier node and each node grouped with the barrier node.

19. The system according to claim 18, wherein performing the optimization using the partitioned intermediate representation further comprises resuming the condition enumeration from a last node grouped with the barrier node.

20. A computer program product for condition analysis, the computer program product comprising a computer readable storage medium having program instructions embodied therewith, the program instructions executable by a processor to cause the processor to perform a method comprising:

receiving an algorithmic description of a hardware design, wherein the algorithmic description is specified using a programming language;

generating an intermediate representation based on the algorithmic description, wherein the intermediate representation includes a plurality of nodes and a plurality of paths, wherein each path connects at least one node to at least one other node;

computing a plurality of relationships between the plurality of nodes, wherein the plurality of relationships are based on the plurality of paths connecting the plurality of nodes and each relationship includes at least one of a dominance relationship and a post-dominance relationship between two or more nodes;

partitioning the intermediate representation based on the computed relationships;

performing an optimization using the partitioned intermediate representation; and converting results of the optimization to the hardware design.

* * * * *